United States Patent
Deacon

(10) Patent No.: US 6,829,264 B2
(45) Date of Patent: Dec. 7, 2004

(54) LASER FREQUENCY AGING COMPENSATION

(75) Inventor: David A. G. Deacon, Los Altos, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/143,063

(22) Filed: May 10, 2002

(65) Prior Publication Data

US 2003/0210718 A1 Nov. 13, 2003

(51) Int. Cl.[7] .................................................. H01S 3/04
(52) U.S. Cl. .............................. 372/36; 372/34; 372/43
(58) Field of Search ................................ 372/34, 36, 43

(56) References Cited

U.S. PATENT DOCUMENTS

| | | | | |
|---|---|---|---|---|
| 5,608,568 A | * | 3/1997 | Blodgett et al. | 359/288 |
| 5,724,376 A | * | 3/1998 | Kish, Jr. et al. | 372/96 |
| 5,776,794 A | * | 7/1998 | McCann | 438/46 |
| 6,027,957 A | * | 2/2000 | Merritt et al. | 438/106 |
| 6,069,023 A | * | 5/2000 | Bernier et al. | 438/107 |
| 6,243,404 B1 | * | 6/2001 | Joyce | 372/34 |
| 6,425,695 B1 | * | 7/2002 | Murata et al. | 385/88 |
| 2002/0100914 A1 | * | 8/2002 | Yoshida | 257/98 |

* cited by examiner

Primary Examiner—Don Wong
Assistant Examiner—Leith Al-Nazer
(74) Attorney, Agent, or Firm—Blakely, Sokoloff, Taylor & Zafman LLP

(57) ABSTRACT

A semiconductor laser diode mounted to a heat sink body has a thermally resistive layer located between the two in order to provide a specified thermal impedance that balances the contrary responses to laser aging and changes in drive current. The required thermal impedance is determined by experimental trial on a plurality of identically mounted test structures differing only in their thermally resistive layer impedances, which are then operated to cause laser aging. The optical mode frequency output from the laser diodes in the test devices are measured under normal operating conditions at least before and after the laser aging, and the thermal impedance value that would result in a substantially zero change in laser output is calculated from these measurements. The resistive layer's thickness and/or doping level may be used to select the desired thermal impedance. As a result, the mounted laser device with this layer is characterized by an effective refractive index of the laser diode that remains substantially constant as the laser ages with constant operating conditions, and thus the device has an age-stable output frequency.

28 Claims, 2 Drawing Sheets

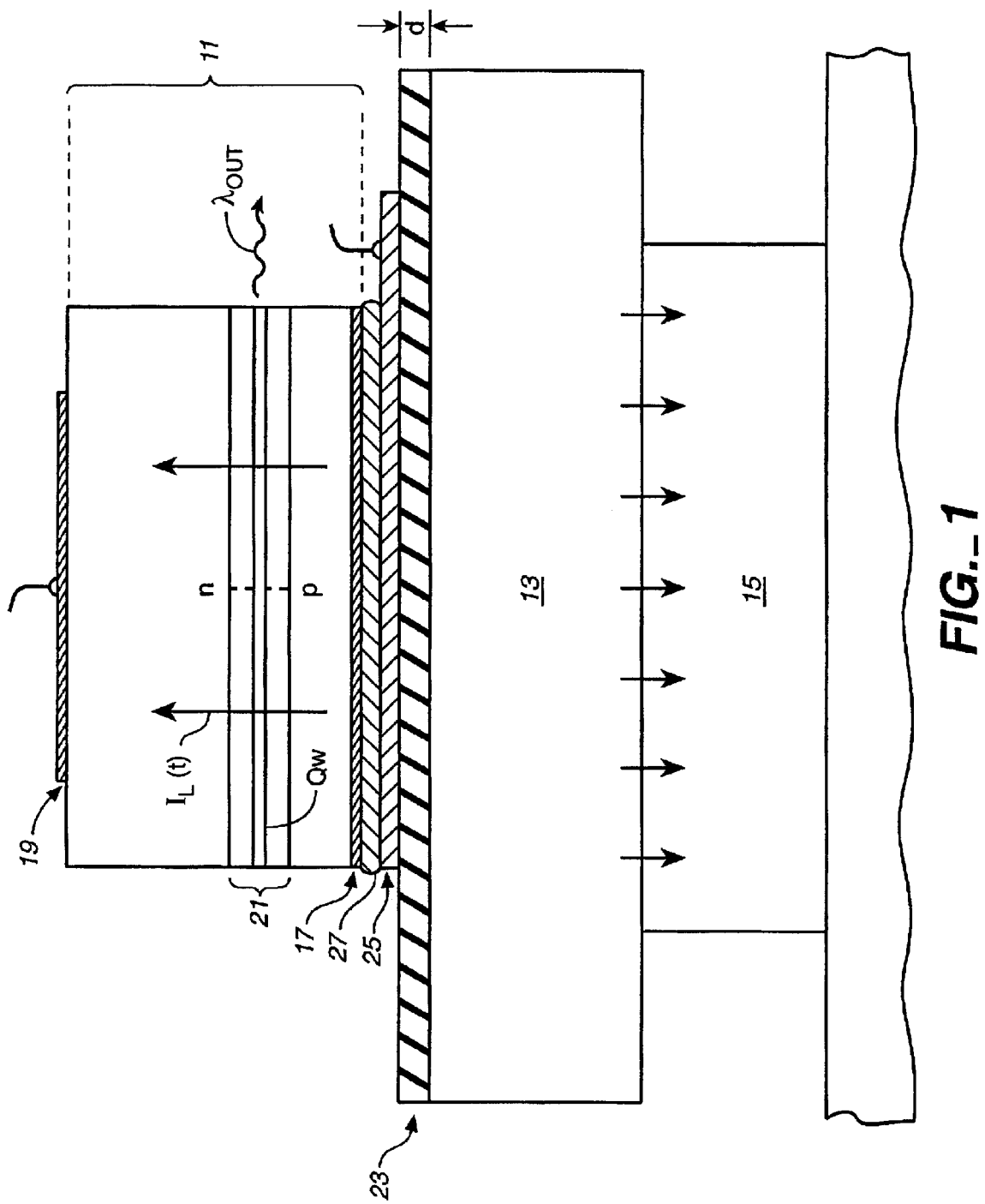

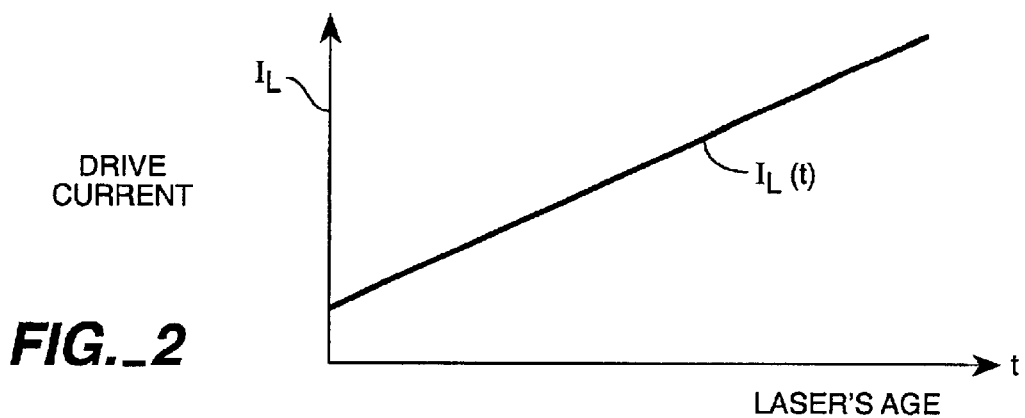
FIG._2
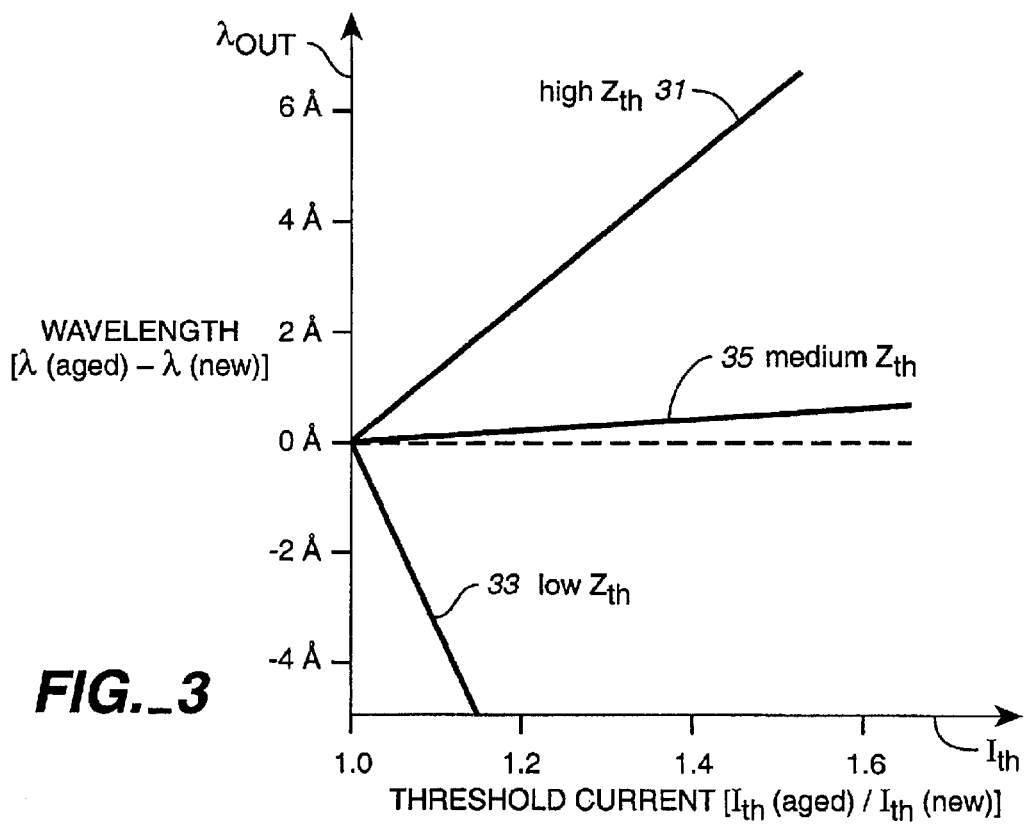
FIG._3
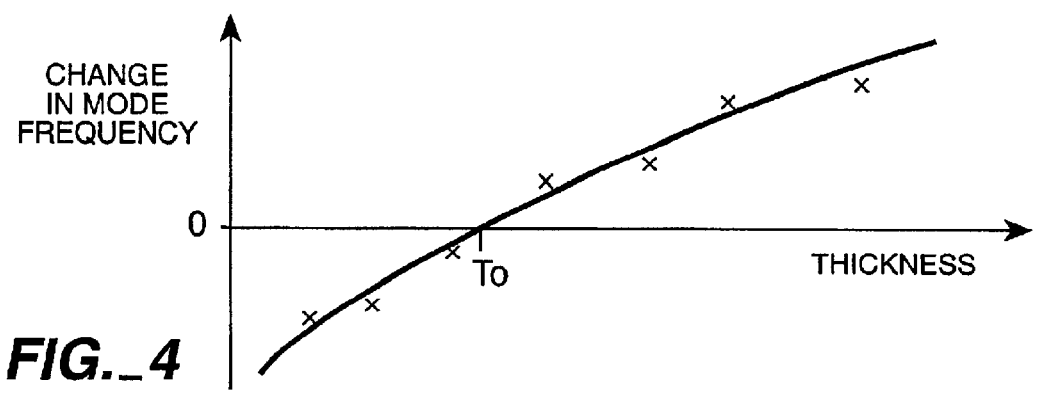
FIG._4

LASER FREQUENCY AGING COMPENSATION

TECHNICAL FIELD

The present invention relates to semiconductor lasers with stable output characteristics useful for optical signal transmission over optical fibers.

BACKGROUND ART

As a semiconductor laser ages, it requires more drive current to output the same optical power level. The output frequency tends to drift away from a desired output frequency because of this necessity of increasing the drive current to maintain the output power as the laser ages. In applications such as telecommunications, where the laser's operating optical frequency must remain within the narrow range of a specified channel, the age-related frequency drift is a problem. Although the input driving current could be kept relatively constant as the laser ages in order to minimize the frequency drift, the output power will then decline over time, which is also detrimental in fiberoptic communications.

Others have attempted to solve this problem by the use of negative feedback systems that actively adjust the laser chip temperature. That is, as the drive current is increased due to laser chip aging, a detection system compensates the temperature of the laser chip to overcome the frequency shifting effects of the increasing drive current. However, monitoring the drive current does not allow effective frequency control, and increasing the chip temperature degrades its lifetime. Hence, this prior solution is not completely adequate.

An object of the present invention is to provide a mounted semiconductor laser device, and a method of constructing the same, that has an age-stable output frequency.

DISCLOSURE OF THE INVENTION

The optical frequency at which a laser operates can be maintained within a more narrow range over the lifetime of the laser by providing a specified thermal impedance between the active region of the laser and the heat sink.

Specifically, two competing mechanisms have opposite effects on the index of refraction in the laser waveguide. First, the increased drive current needed to maintain laser output power levels as the laser ages has the effect of increasing the carrier density in the active region of the laser. The increased carrier density (i.e., electrons and holes) lowers the index of refraction of the material. Second, the increased current causes the laser to be heated. The increased temperature raises the index of refraction. Depending on the way the laser is mounted to the heat sink the thermal impedance may be relatively large or small, changing the size of the temperature swing so that one or the other of these mechanisms dominate. If the laser is mounted with the active region down, i.e. in close proximity to the heat sink with sufficiently low thermal impedance, the carrier density effect dominates and the index of refraction decreases over the lifetime of the laser. If the laser is mounted with the active region up or with sufficiently high thermal impedance, the thermal effects dominate and the refractive index increases over the lifetime of the laser.

In this invention, the thermal impedance is chosen to have a value that results in substantially complete compensation between the two effects. Basically, because the increased current density and increased temperature drive the refractive index of the laser active region in opposite directions, the effects can be essentially cancelled by an appropriate choice of heat sink thermal impedance. The laser may be mounted active region down, but the thermal impedance is selected so that neither effect dominates. This maintains the refractive index of the active region of the laser within a more narrow range, which in turn maintains the operating frequency of the laser at a more accurately controlled optical frequency (or output wavelength).

In order to provide the required amount of thermal impedance, a layer of material having lower thermal conductivity than the heat sink (such as $SiO_2$) is formed between the active layer and the heat sink. It may be formed either on the laser chip or on the heat sink, or on any element interposed therebetween. In a preferred embodiment, the impedance for the required thermal effect can be calculated from measurements of lasers subjected to accelerated aging. Then the calculated thermal impedance is embodied in the silica layer upon fabrication, either by selecting the thickness of the layer, or by selective changes to the composition (e.g. by doping) of the silica layer to adjust its thermal conductivity to the desired level, or both. Essentially, the thickness and composition of the thermal impedance layer will be pre-chosen to obtain a constant index of refraction in the laser despite aging of the device.

An advantage of the invention is that we can obtain a substantially constant index of refraction effect when the drive current is increased as the laser diode ages. With this very much flatter index of refraction change versus laser age, the frequency of the output light generated by the laser would stay longer within design limits. Adjustments would be needed less often, with the laser lasting much longer in service due to its longer operation within the design parameters.

BRIEF DESCRIPTION OF THE DRAWINGS

FIG. 1 is a side sectional view of a laser-diode and heat sink mounting configuration with a controlled thermal impedance heat sink surface in accord with the present invention.

FIG. 2 is a graph of a typical laser diode's drive current versus the laser's operating age such that laser output power remains constant over its lifetime.

FIG. 3 is a graph of a laser's output wavelength (optical frequency) change versus the relative threshold current change over 20 hours of accelerated aging for three possible laser-diode/heat-sink mounting configurations, with the medium $Z_{th}$ configuration consistent with the present invention.

FIG. 4 is a graph of a laser's optical mode frequency change over a given accelerated aging interval (e.g., 1000 hours) versus thermal impedance layer thickness.

BEST MODE OF CARRYING OUT THE INVENTION

With reference to FIG. 1, a diode laser 11 is mounted to a heat sink 13 that is, in turn, mounted onto a thermo-electric cooler or other heat dissipative structure 15. The laser diode 11 can be any of the semiconductor lasers that are commercially available. Such lasers typically have a quantum well active region Qw between p-doped and n-doped semiconductor layer structures. The active region Qw confines carriers injected therein from the adjacent doped layers by means of drive current $I_L(t)$ applied via contact metallurgy 17 and 19. Laser light generated in the structure propagates along an intracavity waveguide 21 defined by index cladding layer structures on either side of the quantum well. The laser light output $\lambda_{OUT}$, characterized by a particular operating optical frequency of the laser, can be injected into an optical fiber by known coupling means.

The heat sink 13, which may be any good thermal conductor, such as silicon, copper, diamond, etc., has a layer 23 of lower thermal conductivity deposited or otherwise formed on its "upper" surface with a specified thickness d. (For convenience, we will refer to the side of the heat sink 13 mounted to the thermo-electric cooler 15 as its "lower" surface, and the side of the heat sink closest to the laser diode 11 as its "upper" surface.) This lower thermal conductivity material may be one of many materials but is preferably based on $SiO_2$ or $Si_3N_4$. It is not a thermal insulator, since heat transfer between the laser diode 11 and heat sink 13 is required. But it does provide thermal impedance that lowers the effectiveness of the heat sink by a desired amount to be described in greater detail below. The thermal impedance layer 23 may be an electrical insulator. The laser's p-side is mounted onto this thermal impedance layer 23 via contact metallurgy that provides both good electrical contact and good thermal contact. Typically, the metal contact 17 contains gold, as does a corresponding metal bonding pad 25 formed on the impedance layer 23. These two metal layers 17 and 25 may be bonded using a gold-tin solder 27. Other bonding materials and techniques could be used, including gold to gold diffusion bonding.

As seen in FIG. 2, as the laser ages (time t), the drive current $I_L(t)$ must be increased to maintain a substantially constant output power from the laser. We want to maintain a constant effective index of refraction of the laser's waveguide 21 under operating conditions in order that the mode frequencies are not changed with laser aging. Hence, we need to compensate for the effects of temperature and carrier density change from the age-induced current increase. In FIG. 3, curve 31 shows the effect of aging on a laser mounted p-side up onto a heat sink where the thermal impedance is relatively large. With the active region and laser waveguide relatively distant from the heat sink, the thermal effects of increased current dominate and the refractive index increases with laser age (manifested here as an increasing output wavelength difference over 20 hours of accelerated laser aging). Curve 33 shows the contrary effect of aging on a laser that has been mounted p-side down onto a heat sink where the thermal impedance is relatively small. With the active region and laser waveguide relatively close to the heat sink, the heat sink is more effective, and the refractive index decreases with laser age.

We can use this not only to balance the two effects using thermal impedance layer 23, but also determine the appropriate thickness of that impedance layer. One can mount laser chips, bonded the same way, on two, three, or more different thicknesses of the desired impedance layer on a heat sink. We then measure the change in mode frequency upon accelerated aging of the laser chips over a partial lifetime, e.g., over 1000 hours or less. Accelerated aging may be accomplished by elevating the temperate of the lasers to 85° C. and running them at high drive currents of as much as 200 mA. A plot (FIG. 4) of mode frequency change as a function of impedance layer thickness obtains a best thickness where the plot crosses zero change in mode frequency. If needed, a second run, based on the data obtained from a first trial run could be made with different set of impedance layer thicknesses closer to the desired thickness to obtain a more linear fit. Although individual fabricated lasers of a given kind will differ slightly in their aging characteristics, the compensation does not need to be exact as a substantial improvement will still occur. Curve 35 in FIG. 3, shows a laser mounted p-side down to a thermal impedance layer of appropriate thickness. The mode frequency change versus laser aging is considerably flattened from either prior example (curves 31 and 33).

What is claimed is:

1. A mounted semiconductor laser device that has an age-stable output frequency, comprising:
   a laser diode mounted p-side down to a heat sink body to draw heat away from the laser diode, and
   a thermally resistive layer located between the laser diode and the heat sink body, the thermally resistive layer having a thermal impedance to balance the effects of increased carrier density and increased temperature on an index of refractive of the laser diode caused by an increased drive current as the laser diode ages such that the index of refraction of the laser diode remains substantially constant as the laser diode ages with constant operating conditions.

2. The mounted device of claim 1 wherein said heat sink body includes a thermo-electric cooler.

3. The mounted device of claim 2 wherein said thermo-electric cooler is located on a side of said heat sink body that is opposite from said laser diode.

4. The mounted device of claim 1 wherein said thermally resistive layer has a thickness selected to provide said thermal impedance.

5. The mounted device of claim 1 wherein said thermally resistive layer comprises a silica layer.

6. The mounted device of claim 1 wherein said thermally resistive layer has a doping level selected to provide said thermal impedance.

7. The mounted device of claim 1 wherein a second heat sink body is mounted on an opposite side of the laser diode from the heat sink body, whereby heat flow away from said laser diode is divided in two directions.

8. A method of constructing a mounted semiconductor laser device having age-stable output frequency, comprising:
   providing a heat sink with a thermally resistive layer on a surface thereof, the thermally resistive layer having a specified thermal impedance; and
   mounting a laser diode p-side down onto the thermally resistive layer;
   wherein the thermal impedance of the thermally resistive layer has been determined by an experimental trial in which a plurality of identically mounted test laser diode/thermally resistive layer/heat sink structures, with different thermally resistive layer impedances, are operated so as to cause laser aging and the optical mode frequency output of the laser diodes are measured under normal operating conditions at least before and after said experimental trial, and then a thermal impedance value that would result in a substantially zero change in optical mode frequency output over laser aging is determined from said measurements.

9. The method of claim 8 wherein said normal operating conditions comprises:
   monitoring an output power of the laser diode; and
   increasing the drive current applied to the laser diode to maintain the output power of the laser diode at a constant level.

10. The method of claim 8 wherein the maximum duration of the experimental trial is limited to a change in mode frequency that is not more than one-half of the free spectral range of the laser diode.

11. The method of claim 8 wherein the experimental trial comprises accelerates laser aging.

12. The method of claim 11 wherein the accelerated aging is provided by operating the laser diode at elevated temperature and high drive current, the laser diode being operated under normal operating conditions during the measurement of the optical mode frequency output.

13. The method of claim 8 wherein the measurements are made a plurality of times during the experimental trial.

14. The method of claim 8 wherein the sink temperature is constant during each measurement associated with the experimental trial.

15. The method of claim 8 wherein the heat sink includes a thermo-electric cooler.

16. The method of claim 8 wherein the thermal impedance is provided by a particular thickness of said thermally resistive layer.

17. The method of claim 8 wherein the thermal impedance is provided by a particular doping level of said thermally resistive layer material.

18. The method of claim 8 wherein a second heat sink is mounted on an opposite side of the laser diode from the heat sink, the experimental trial being conducted using identically mounted structures.

19. A mounted semiconductor laser device that has an age-stable output frequency, comprising:
   a laser diode mounted to a heat sink body to draw heat away from the laser diode; and
   a thermally resistive layer located in the thermal flow path from the laser diode through the heat sink body, the thermally resistive layer having a thermal impedance to balance the effects of increased carrier density and increased temperature on an index of refraction of the laser diode caused by an increased drive current as the laser diode ages such that the index of refraction of the laser diode remains substantially constant as the laser diode ages with constant operating conditions.

20. The mounted device of claim 19 wherein said thermally resistive layer is coextensive with said heat sink body, the heat sink body having a thermal impedance selected to balance the effects of increased carrier density and increased temperature on the index of refraction of the laser diode as the laser diode ages such that the index of refraction of the laser diode remains substantially constant as the laser diode ages with constant operating conditions.

21. The mounted device of claim 20 wherein said heat sink body has a thickness selected to provide said thermal impedance.

22. The mounted device of claim 20 wherein said thermally resistive layer has a composition selected to provide said thermal impedance.

23. The mounted device of claim 19 wherein said heat sink body includes a thermo-electric cooler.

24. The mounted device of claim 23 wherein said thermo-electric cooler is located on a side of said heat sink body that is opposite from said laser diode.

25. The mounted device of claim 19 wherein said thermally resistive layer has a thickness selected to provide said thermal impedance.

26. The mounted device of claim 19 wherein said thermally resistive layer comprises a silica layer.

27. The mounted device of claim 19 wherein said thermally resistive layer has a composition selected to provide said thermal impedance.

28. The mounted device of claim 19 wherein a second heat sink body is mounted on an opposite side of the laser diode from the heat sink body, whereby heat flow away from said laser diode is divided in two directions.

* * * * *

UNITED STATES PATENT AND TRADEMARK OFFICE
CERTIFICATE OF CORRECTION

PATENT NO. : 6,829,264 B2
DATED : December 7, 2004
INVENTOR(S) : Deacon

It is certified that error appears in the above-identified patent and that said Letters Patent is hereby corrected as shown below:

Column 4,
Line 16, delete "refractive" and insert -- refraction --.

Column 5,
Line 2, delete "accelerates" and insert -- accelerating --.
Line 3, delete "the accelerated aging" and insert -- accelerating laser aging --.

Signed and Sealed this

Seventeenth Day of May, 2005

JON W. DUDAS
*Director of the United States Patent and Trademark Office*